United States Patent [19]
Ono et al.

[11] Patent Number: 5,844,320
[45] Date of Patent: Dec. 1, 1998

[54] SEMICONDUCTOR UNIT WITH SEMICONDUCTOR DEVICE MOUNTED WITH CONDUCTIVE ADHESIVE

[75] Inventors: Masahiro Ono; Yoshihiro Bessho, both of Osaka, Japan

[73] Assignee: Matsushita Electric Industrial Co., Ltd., Osaka, Japan

[21] Appl. No.: 812,754

[22] Filed: Mar. 6, 1997

[30] Foreign Application Priority Data

Mar. 6, 1996 [JP] Japan ................................ 8-049368

[51] Int. Cl.⁶ .................................................. H01L 23/48
[52] U.S. Cl. ........................ 257/778; 257/779; 257/781; 257/782; 257/783
[58] Field of Search .................... 207/777, 778, 207/779, 780, 781, 782, 783, 784, 737, 772

[56] References Cited

U.S. PATENT DOCUMENTS 5,436,503  7/1995  Kunitomo et al. ...................... 257/781

FOREIGN PATENT DOCUMENTS 5-166879  7/1993  Japan .

OTHER PUBLICATIONS

Jan. 15, 1980 "IC KA Jissou Gijutsu", edited by Japan Microelectronics Association, published by Institute for Industrial Research, pp. 80–85. (with English asbstract).

*Primary Examiner*—Minh-Loan Tran
*Attorney, Agent, or Firm*—Merchant, Gould, Smith, Edell, Welter & Schmidt, P.A.

[57] ABSTRACT

A semiconductor unit, in which a semiconductor device having protruding electrodes is mounted face down onto the terminal electrodes of a circuit board through a bonding layer made of at least two kinds of conductive adhesive, and a method for manufacturing the semiconductor unit.

5 Claims, 8 Drawing Sheets

SEMICONDUCTOR UNIT WITH SEMICONDUCTOR DEVICE MOUNTED WITH CONDUCTIVE ADHESIVE

FIELD OF THE INVENTION

This invention relates to a semiconductor unit with improved connection reliability between a semiconductor device and a circuit board, and a method for manufacturing the semiconductor unit.

BACKGROUND OF THE INVENTION

Conventionally, a wire bonding method applying soldering has been widely used in mounting a semiconductor device onto the input-output terminal electrodes of a circuit board. However, with the recent size minimization of semiconductor device packages and increase in the number of connecting terminals, gaps between connecting terminals are becoming narrow, so that it is increasingly difficult to mount using the conventional soldering technique.

Thus, methods have been proposed recently in which the mounting area is minimized by directly mounting a semiconductor device such as an integrated circuit chip onto the input-output terminal electrodes of a circuit board.

Among these methods, a flip chip mounting method—a method of mounting a semiconductor device face down onto a circuit board—can electrically connect the semiconductor device and the circuit board at the same time, and has excellent mechanical strength after the bonding process.

For example, a mounting method applying a soldering plating method is described in IC KA JISSOU GIJYUTSU (edited by Japan Microelectronics Association and Published by Institute for Industrial Research on Jan. 15, 1980), and the method is explained below.

FIG. 7 (a) is a cross-sectional view of a solder bump in a conventional semiconductor device. FIG. 7 (b) is a cross-sectional view of a conventional semiconductor unit. In connecting an electrode pad 113 of a semiconductor device (IC substrate) 116 to an input-output terminal electrode 118 of a circuit board 119, an electrical contact 110 (hereinafter, referred to as "solder bump") made of solder is formed by a plating method on a diffusion-preventing metal film 111 after forming an adhering metal film 112 and diffusion-preventing metal film 111 on electrode pad 113 by a deposition method (FIG. 7 (a)). Then, as shown in FIG. 7 (b), the IC chip prepared as mentioned above (FIG. 7 (a)) is positioned so as to place solder bump 110 face down onto input-output terminal electrode 118 of circuit board 119. By heating the mounted body (semiconductor unit) of semiconductor device (IC substrate) 116 at a high temperature, solder bump 110 is melted and adhered to input-output terminal electrode 118 of circuit board 119.

A semiconductor unit as shown in FIG. 8 also has been proposed recently. FIG. 8 is a cross-sectional view of a conventional semiconductor unit in which a conductive adhesive is applied. As shown in the figure, an electrical contact (Au bump) 120 is formed onto an electrode pad 123 of a semiconductor device (IC substrate) 126 by a wire bonding method or a plating method. Through conductive adhesive (bonding layer) 125, Au bump 120 is connected to an input-output terminal electrode 128 of a circuit board 129. In this semiconductor unit, conductive adhesive 125 is transferred onto Au bump 120 of semiconductor device 126, and Au bump 120 is then positioned so as to be placed onto input-output terminal electrode 128 of circuit board 129. Conductive adhesive 125 is cured, thus establishing an electrical connection.

Furthermore, a semiconductor unit is proposed which is underfilled with under-fill resin so as to enhance connection and bonding between a semiconductor device and a circuit board. In this semiconductor unit, the process of underfilling the under-fill resin and a curing process have to be carried out.

The conventional semiconductor devices and mounted bodies (semiconductor units) mentioned above, however, have the following problems.

Although the terminal electrode of the circuit board usually has a surface made of Au, Au has poor reactivity, so that the conductive adhesive and the terminal electrode are unlikely to adhere to each other. In addition to poor adherence, contact resistance at the boundary between the conductive adhesive and the terminal electrode is high. Contact resistance also is high at the boundary between the protruding electrode of the semiconductor device and the conductive adhesive. Therefore, the connection and bonding between the semiconductor device and the cirucuit board are not reliable.

Particularly, in carrying out a thermal test such as the temperature cycle test, the adhesive strength is weakened considerably by the stress of thermal expansion and also by moisture absorption since there are differences in thermal expansion coefficients between the semiconductor device, circuit board and under-fill resin, thus forming cracks and peeling at bulk sections. As a result, the boundary connection and bonding become weak, and the resistance of the electrical contact (Au bump) increases.

SUMMARY OF THE INVENTION

This invention aims to solve the above-mentioned conventional problems, thus improving the reliability of the mounted body (semiconductor unit) of a semiconductor device by providing a semiconductor unit having superior durability and a method for manufacturing the unit.

In order to achieve the above-noted object, the semiconductor unit of the invention has a semiconductor device, having protruding electrodes (bumps), mounted face down onto the terminal electrode of a circuit board. The protruding electrodes (bumps) of the semiconductor device are electrically connected to the terminal electrode of the circuit board through a bonding layer made of at least two kinds of conductive adhesives.

It is preferable that the semiconductor unit is underfilled with under-fill resin made of an inorganic rigid filler and organic resin so as to surround at least the bonding layer.

It is also preferable that the protruding electrodes (bumps) are made of at least one material selected from the group consisting of Au, Cu, Al and solder.

It is further preferable that the bonding layer is made of a first conductive adhesive, including conductive fillers containing at least two kinds of atoms, and a second conductive adhesive, made of conductive fillers containing simple substance atoms, and that at least a section of the second conductive adhesive is in contact with the terminal electrodes of the circuit board.

It is preferable that the under-fill resin has a pH$\leq$8.

The method for manufacturing a semiconductor unit of the invention includes mounting a semiconductor device having protruding electrodes (bumps) face down onto the terminal electrodes of a circuit board through a bonding layer. The method includes the step of forming the bonding layer made of at least two kinds of conductive adhesive between the protruding electrodes (bumps) of the semiconductor device and the terminal electrodes of the circuit board.

It is preferable in the method that the bonding layer is formed by the steps of transferring a first conductive adhesive, made of conductive fillers containing at least two kinds of atoms, onto the protruding electrodes (bumps) of the face down semiconductor device; and then transferring a second conductive adhesive, made of fillers containing simple substance atoms, onto the protruding electrodes (bumps) provided with first conductive adhesive.

It is also preferable in the method that the bonding layer is formed by the steps of transferring a first conductive adhesive, made of conductive fillers containing at least two kinds of atoms, onto the protruding electrodes (bumps) of the face down semiconductor device; coating a second conductive adhesive, made of conductive fillers containing simple substance atoms, onto the mounting sections of the terminal electrodes of the circuit board separately; and then mounting the semiconductor device onto the terminal electrodes of the circuit board.

It is further preferable in the method that the bonding layer is formed by the steps of coating a second conductive adhesive, made of conductive fillers containing simple substance atoms, onto the terminal electrodes of the circuit board by transferring the adhesive onto the protruding electrodes (bumps) of the semiconductor device, setting the device in contact with the terminal electrode of the circuit board in the face down condition and then lifting the device; transferring the second conductive adhesive onto the protruding electrodes (bumps) again; then transferring a first conductive adhesive, made of conductive fillers containing at least two kinds of atoms, onto the protruding electrodes (bumps); and mounting the semiconductor device onto the terminal electrodes of the circuit board.

It is preferable in the method that the bonding layer is formed by the steps of transferring a second conductive adhesive, made of conductive fillers including simple substance atoms, onto the protruding electrodes (bumps) of the semiconductor device; transferring a first conductive adhesive, made of conductive fillers including at least two kinds of atoms, onto the protruding electrodes (bumps); also coating the second conductive adhesive onto the mounting sections of the terminal electrodes separately; and then mounting the semiconductor device onto the terminal electrodes of the circuit board.

In the semiconductor unit of the invention, the semiconductor device having the protruding electrodes (bumps) is mounted face down onto the terminal electrodes of the circuit board, and the protruding electrodes (bumps) of the semiconductor device are electrically connected to the terminal electrodes of the circuit board through the bonding layer made of at least two kinds of conductive adhesives. Thus, the adhesive strength at a boundary between the conductive adhesive and the protruding electrodes (bumps) of the semiconductor device and a boundary between the conductive adhesive and the terminal electrodes of the circuit board is enhanced, and contact resistance at the boundaries is reduced. As a result, the reliability of boundary bonding improves, and a decrease in reliability is also prevented.

Since the semiconductor unit of the invention is under-filled with the under-fill resin made of an inorganic rigid filler and organic resin so as to surround at least the bonding layer, bonding between the semiconductor device and the circuit board is reinforced.

The protruding electrodes (bumps) of the semiconductor unit of the invention are made of at least one material selected from the group consisting of Au, Cu, Al and solder, so that the protruding electrodes (bumps) have low specific resistance and the reliability of bonding and connection between the semiconductor device and the cirucuit board does not deteriorate.

In the semiconductor unit of the invention, the bonding layer is made of the first conductive adhesive, including conductive fillers containing at least two kinds of atoms, and the second conductive adhesive, including conductive fillers containing simple substance atoms, and at least a section of the second conductive adhesive is in contact with the terminal electrodes of the circuit board. Therefore, the increase in contact resistance at boundaries is prevented by the conductive fillers containing simple substance atoms.

The under-fill resin has a $pH \leq 8$, so that the fillers in the under-fill resin are dispersed in a preferable condition due to the surface charge, which is controlled by the size of the filler and the pH.

The method of manufacturing a semiconductor unit of the invention includes mounting a semiconductor device having protruding electrodes (bumps) face down onto the terminal electrodes of a circuit board through a bonding layer. The method includes the step of forming the bonding layer made of at least two kinds of conductive adhesives between the protruding electrodes (bumps) of the semiconductor device and the terminal electrodes of the circuit board. As a result, the adhesive strength at the boundary between the conductive adhesive and the terminal electrodes of the circuit board is improved and the contact resistance at the boundary is reduced, so that the reliability of boundary bonding improves and a semiconductor unit with improved reliability is provided.

As mentioned above, the manufacturing method of the invention includes the steps of transferring a first conductive adhesive made of conductive fillers containing at least two kinds of atoms onto the protruding electrodes (bumps) of the face down semiconductor device, and transferring a second conductive adhesive made of conductive fillers containing simple substance atoms onto the protruding electrodes (bumps), thereby forming a bonding layer. As a result, the increase in contact resistance at a boundary with the circuit board having poor adhesive strength is prevented by applying the conductive fillers containing simple substance atoms.

The manufacturing method, as described above, includes the steps of transferring a first conductive adhesive made of conductive fillers containing at least two kinds of atoms onto the protruding electrodes (bumps) of the face down semiconductor device, coating a second conductive adhesive made of conductive fillers containing simple substance atoms onto the mounting sections of the terminal electrodes of the circuit board, and mounting the semiconductor device onto the terminal electrodes of the circuit board, thus forming a bonding layer. In other words, the conductive adhesive made of the conductive fillers containing simple substance atoms is in contact with the electrodes of the circuit board having poor adhesive strength, so that the increase in contact resistance at the boundary is reduced.

As mentioned above, the manufacturing method includes the steps of coating a second conductive adhesive made of conductive fillers containing simple substance atoms on the terminal electrodes of the circuit board after transferring the adhesive onto the protruding electrodes (bumps) of the semiconductor device, setting the device in contact with the terminal electrodes in the face down condition and then lifting the device; transferring the second conductive adhesive onto the protruding electrodes (bumps) of the semiconductor device again; transferring a first conductive adhesive made of conductive fillers containing at least two kinds of atoms onto the protruding electrodes (bumps); and then mounting the semiconductor device onto the terminal electrodes of the circuit board, thus forming a bonding layer. The conductive adhesive made of the conductive fillers containing simple substance atoms is applied at the protruding electrodes (bumps) and the terminal electrodes, so that the reliability of connection and bonding between the semiconductor device and the circuit board improves.

The manufacturing method as mentioned above includes the steps of transferring a second conductive adhesive made of conductive fillers containing simple substance atoms onto the protruding electrodes (bumps) of the semiconductor device, then transferring a first conductive adhesive made of conductive fillers containing at least two kinds of atoms onto the protruding electrodes (bumps), coating the second conductive adhesive onto the mounting sections of the terminal electrodes separately, and then mounting the semiconductor device onto the terminal electrodes of the circuit board, thus forming a bonding layer. Therefore, the reliability of connection and bonding between the semiconductor device and the circuit board improves.

BRIEF DESCRIPTION OF THE INVENTION

FIGS. 1 (*a*), (*b*) and (*c*) are cross-sectional views showing a manufacturing method for a semiconductor unit of a first embodiment of the invention.

FIGS. 2 (*a*), (*b*) and (*c*) are cross-sectional views showing a manufacturing method for a semiconductor unit of a second embodiment of the invention.

FIGS. 3 (*a*), (*b*), (*c*), (*d*) and (*e*) are cross-sectional views showing a manufacturing method for a semiconductor unit of a third embodiment of the invention.

FIG. 4 is a cross-sectional view of the semiconductor unit of the third embodiment of the invention.

FIGS. 5 (*a*), (*b*) and (*c*) are cross-sectional views showing a manufacturing method for a semiconductor unit of a fourth embodiment of the invention.

FIG. 7 (*b*) is a cross-sectional view of a conventional semiconductor unit having a solder bump.

DETAILED DESCRIPTION OF THE INVENTION

Hereinafter, the invention is further explained by referring to the following embodiments.

(First Embodiment)

Figure 1A:
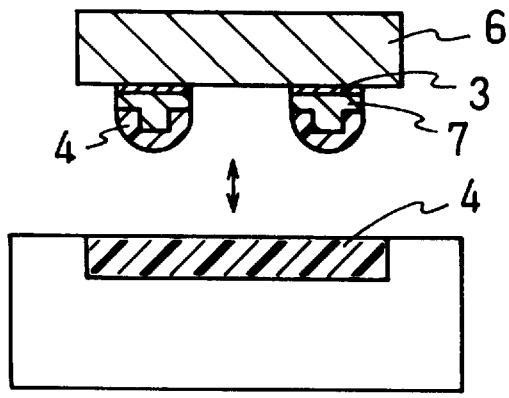
Figure 1B:
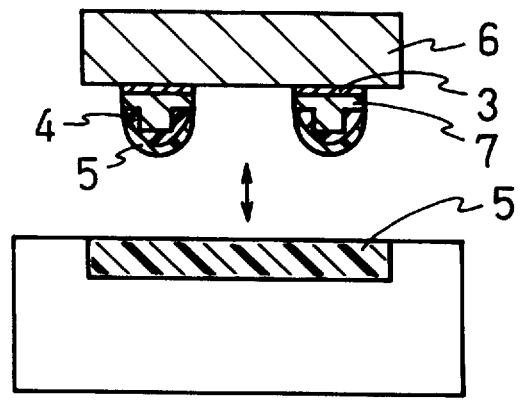
Figure 1C:
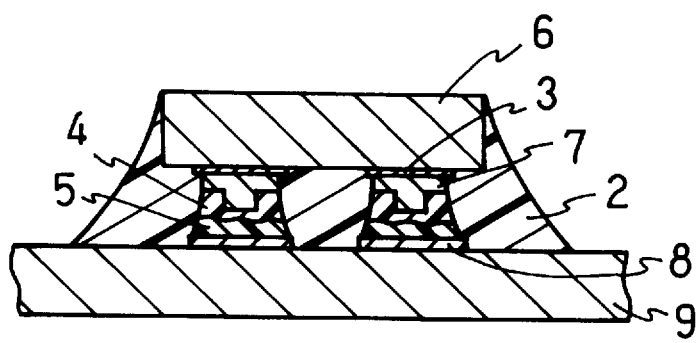

FIGS. 1 (*a*), (*b*) and (*c*) are cross-sectional views showing the manufacturing method for a semiconductor unit of the first embodiment of the invention.

As shown in these figures, two-step protruding electrodes (bumps) 7 made of Au are formed on an electrode pad 3 of a semiconductor device (IC chip) 6. On the other hand, input-output terminal electrodes 8 are formed on a circuit board 9.

First of all, as shown in FIG. 1 (*a*), a first conductive adhesive 4 made of conductive fillers containing at least two kinds of atoms—for example, AgPd conductive filler—is transferred onto protruding electrodes (bumps) 7 of face down semiconductor device (IC chip) 6. Then, as shown in FIG. 1 (*b*), a second conductive adhesive 5 made of conductive fillers containing simple substance atoms—such as Ag conductive fillers—is transferred onto the protruding electrodes (bumps) 7, which is transferred with first conductive adhesive 4. As a result, a bonding layer composed of first conductive adhesive 4 and second conductive adhesive 5 is formed on protruding electrodes (bumps) 7. As shown in FIG. 1 (*c*), second conductive adhesive 5 is then adhered onto input-output terminal electrodes 8 of circuit substrate 9, and semiconductor device (IC chip) 6 is mounted face down on a circuit board 9. Finally, gaps between the semiconductor device (IC chip) 6 and circuit board 9 and the sides of semiconductor device (IC chip) 6 are underfilled with a under-fill resin 2 (which has a pH of about 4) made of inorganic rigid fillers (for instance, silica) and organic resin (e.g., epoxy-based resin). As a result, a semiconductor unit is provided.

In the semiconductor unit mentioned above, the protruding electrodes (bumps) 7 of semiconductor device (IC chip) 6 and input-output terminal electrodes 8 of circuit board 9 are electrically connected through the bonding layer made of the two kinds of conductive adhesive (first and second conductive adhesives 4 and 5), so that the adhesive strength increases at the boundary between first conductive adhesive 4 and protruding electrodes (bumps) 7 of semiconductor device (IC chip) and at the boundary between second conductive adhesive 5 and input-output terminal electrodes 8 of circuit substrate 9. In addition, the contact resistance at the boundary decreases. Therefore, the reliability of boundary bonding increases, and a decrease in reliability is prevented. When first conductive adhesive 4 made of conductive fillers containing at least two kinds of atoms is used as one kind of conductive adhesive, migration properties become excellent. With the application of second conductive adhesive 5 made of conductive fillers containing simple substance atoms as another kind of conductive adhesive, the reliability of boundary bonding improves. In addition, since the gaps between the semiconductor device (IC chip) 6 and circuit board 9 and the sides of semiconductor device (IC chip) 6 are underfilled, the connection between semiconductor device (IC chip) 6 and circuit board 9 is reinforced.

The bonding layer is not limited to the bonding layer made of two kinds of conductive adhesive (first and second conductive adhesives 4 and 5). A bonding layer may be formed by applying more than two types of conductive adhesive.

Even though Ag is used as the conductive filler including simple substance atoms, the filler is not limited to this. For instance, a conductive filler such as Ni or Cu also can be used.

A conductive filler including at least two kinds of atoms is not limited to the AgPd conductive filler mentioned in this embodiment. For example, a conductive filler such as AgCu and AuPt can be used.

Although two-step protruding electrodes (bumps) 7 are used in this embodiment, the shape of the protruding electrodes is not limited to this. However, if the protruding electrodes (bumps) have the two-step shape, no excess amount of conductive adhesive is adhered to the edges of the protruding electrodes (bumps) and the adhesive is coated on the protruding electrodes (bumps) in a preferable amount.

The material of protruding electrodes (bumps) 7 is not limited to Au. The material may be Cu, Al, solder or alloys of Cu, Al and solder.

In this embodiment, the gaps between semiconductor device (IC chip) 6 and circuit board 9 and the sides of semiconductor device (IC chip) 6 are underfilled with under-fill resin 2. However, the underfilling is not limited to this as long as at least the bonding layer (conductive adhesive 4 and 5) is surrounded with the under-fill resin.

The hydrogen ion concentration (pH) of under-fill resin 6 is not limited to around 4 as mentioned in this embodiment. If the pH$\leq$8, the dispersion of the filler in under-fill resin 2 becomes excellent by the surface potential, which is controlled by the size of the filler and pH.

(Second Embodiment)

Figure 2A:
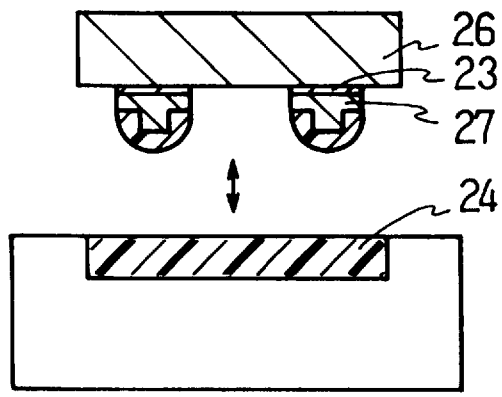
Figure 2B:
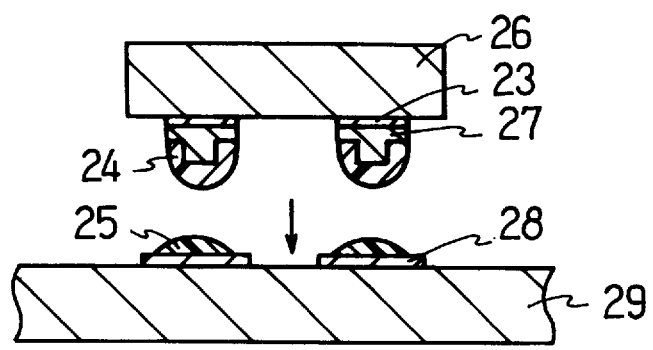
Figure 2C:
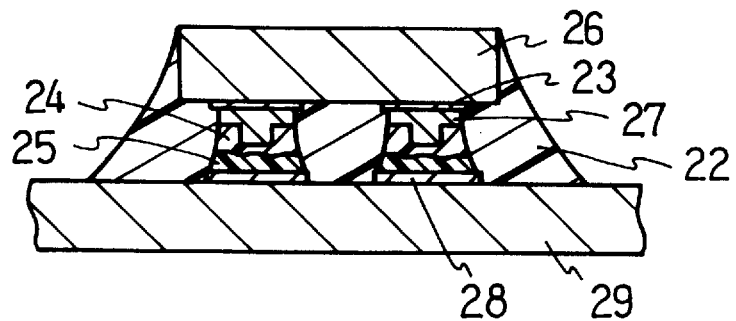
Figure 3A:
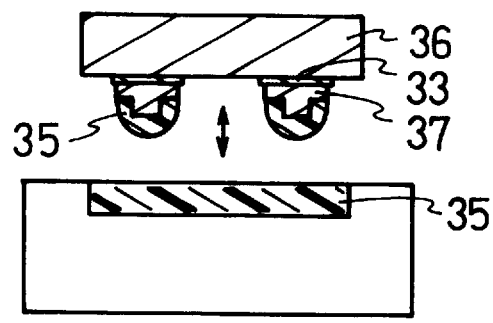
Figure 3B:
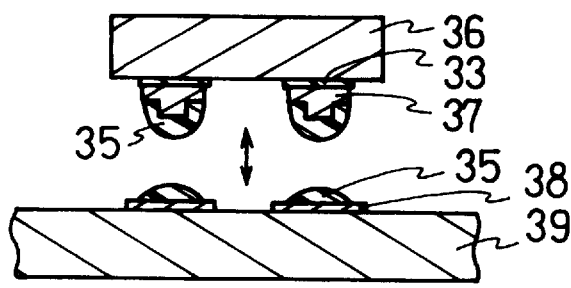
Figure 3C:
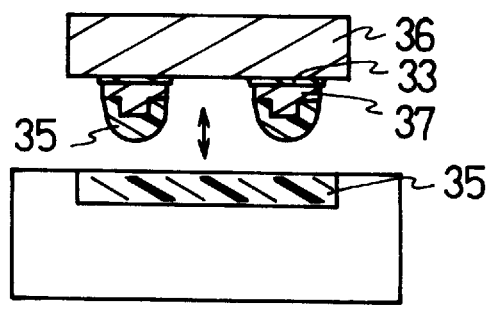
Figure 3D:
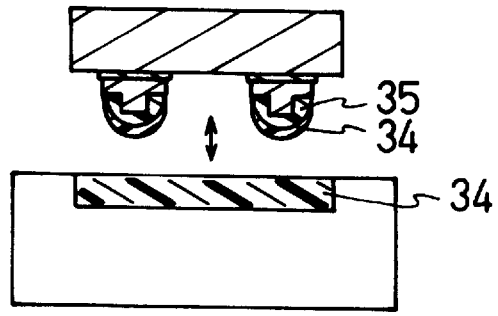
Figure 3E:
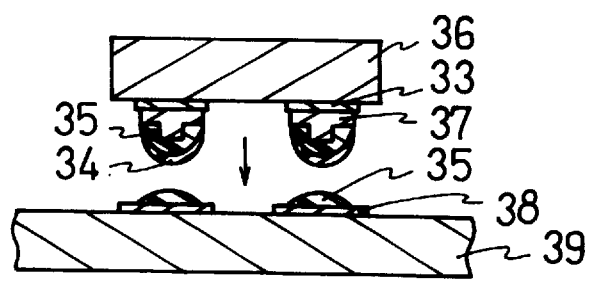

FIGS. 2 (a), (b) and (c) are cross-sectional views showing the manufacturing method for a semiconductor unit of the second embodiment of the invention.

As shown in these figures, two-step protruding electrodes (bumps) 27 made of Au are formed on an electrode pad 23 of a semiconductor device (IC chip) 26. On the other hand, input-output terminal electrodes 28 are formed on a circuit board 29. On the mounting sections of input-output terminal electrodes 28, a second conductive adhesive 25 made of conductive fillers containing simple substance atoms—for example, Ag filler—is coated beforehand (FIG. 2 (b)). This second conductive adhesive 25 is coated, for instance, by transferring a conductive adhesive, made of conductive fillers containing simple substance atoms, onto another face down semiconductor device, setting the device in contact with the mounting sections of input-output terminal electrodes 28, and then lifting the device.

First of all, as shown in FIG. 2 (a), a first conductive adhesive 24 made of conductive fillers containing at least two kinds of atoms—for example, AgPd conductive filler—is transferred onto protruding electrodes (bumps) 27 of a face down semiconductor device (IC chip) 26. Then, semiconductor device (IC chip) 26 is mounted face down onto circuit board 29 so as to set first conductive adhesive 24 in contact with second conductive adhesive 25 coated on input-output terminal electrode 28 of circuit board 29. Thus, semiconductor device (IC chip) 26 is mounted on circuit board 29 through a bonding layer made of first and second conductive adhesives 24 and 25. Then, gaps between semiconductor device (IC chip) 26 and circuit board 29 and the sides of semiconductor device (IC chip) 26 are underfilled with a under-fill resin 22 made of an inorganic rigid filler and organic resin. As a result, a semiconductor unit is provided.

In the semiconductor unit of this embodiment, the protruding electrodes (bumps) 27 of semiconductor device (IC chip) 26 and input-output terminal electrodes 28 of circuit board 29 are electrically connected through the bonding layer as described above. Thus, contact resistance at the boundary between second conductive adhesive 25 and circuit board 29 decreases, and the reliability of the boundary connection and bonding improves.

Although two-step protruding electrodes (bumps) 27 are used in this embodiment, the shape of the protruding electrodes is not limited to this. However, if the protruding electrodes (bumps) have the two-step shape, no excess amount of conductive adhesive is fixed to the edges of the protruding electrodes (bumps) and the adhesive is coated on the protruding electrodes (bumps) in a preferable amount.

The material of protruding electrodes (bumps) 27 is not limited to Au. The material may be Cu, Al, solder or alloys of Cu, Al and solder.

In this embodiment, the gaps between semiconductor device (IC chip) 26 and circuit board 29 and the sides of semiconductor device (IC chip) 26 are underfilled with under-fill resin 22. However, the underfilling is not limited to this as long as at least the bonding layer (made of first and second conductive adhesives 24 and 25) is surrounded with the under-fill resin.

(Third Embodiment)

Figure 4:
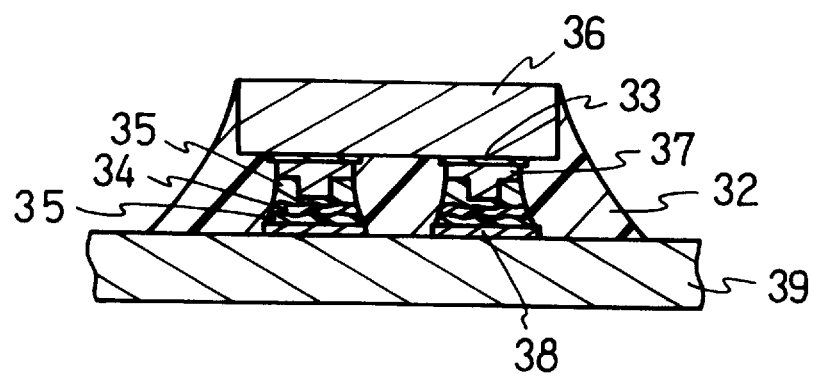

FIGS. 3 (a),(b),(c),(d) and (e) are cross-sectional views showing the manufacturing method for a semiconductor unit of the third embodiment of the invention. FIG. 4 is a cross-sectional view of the semiconductor unit of the third embodiment.

As shown in these figures, two-step protruding electrodes (bumps) 37 made of Au are formed on electrode pads 33 of a semiconductor device (IC chip) 36. On the other hand, input-output electrodes 38 are formed on a circuit board 39.

First of all, as shown in FIG. 3 (a), a second conductive adhesive 35 made of conductive fillers containing simple substance atoms—for example, Ag conductive filler—is transferred onto protruding electrodes (bumps) 37 of face down semiconductor device (IC chip) 36. Then, as shown in FIG. 3 (b), semiconductor device (IC chip) 36, which has second conductive adhesive 35 on its protruding electrodes (bumps) 37, is set face down in contact with the mounting sections of input-output terminal electrodes 38 of circuit board 39 and is then lifted, thus coating second conductive adhesive 35 on input-output terminal electrode 38 of circuit board 39. As in FIG. 3 (c), protruding electrodes (bumps) 37 of face down semiconductor device (IC chip) 36 are again provided with conductive adhesive 35 made of conductive fillers containing simple substance atoms—such as Ag conductive filler. Then, protruding electrodes (bumps) 37 having conductive adhesive 35 are further provided with a first conductive adhesive 34 made of conductive fillers containing at least two kinds of atoms such as an AgPd conductive filler (FIG. 3 (d)). As a result, protruding electrodes (bumps) 37 are formed with a bonding layer made of first and second conductive adhesives 34 and 35. Then, as shown in FIG. 3 (e) and FIG. 4, the first conductive adhesive 34 on the protruding electrodes (bumps) 37 is set in contact with second conductive adhesive 35 on input-output terminal electrodes 38, and semiconductor device (IC chip) 36 is mounted face down on circuit board 39. Finally, as shown in FIG. 4, the gaps between semiconductor device (IC chip) 36 and circuit board 39 and the sides of semiconductor device (IC chip) 36 are underfilled with a under-fill resin 32 made of an inorganic rigid filler and organic resin. As a result, a semiconductor unit is provided.

In the semiconductor unit of this embodiment, protruding electrodes (bumps) 37 of semiconductor device (IC chip) 36 and input-output terminal electrodes 38 of circuit board 39 are electrically connected through the bonding layer as described above. Thus, contact resistance at the boundary between second conductive adhesive 35 and protruding electrodes (bumps) 37 and the boundary between second conductive adhesive 35 and circuit board 39 decreases, so that the reliability of boundary bonding and connection improves.

Although two-step protruding electrodes (bumps) 37 are used in this embodiment, the shape of the protruding electrodes is not limited to this. However, if the protruding electrodes (bumps) have the two-step shape, no excess amount of conductive adhesive is fixed to the edges of the protruding electrodes (bumps) and the adhesive is coated on the protruding electrodes (bumps) in a preferable amount.

The material of protruding electrodes (bumps) 37 is not limited to Au. The material may be Cu, Al, solder or alloys of Cu, Al and solder.

In this embodiment, the gaps between semiconductor device (IC chip) 36 and circuit board 39 and the sides of semiconductor device (IC chip) 36 are underfilled with under-fill resin 32. However, the underfilling is not limited to this as long as at least the bonding layer (made of first and second conductive adhesives 34 and 35) is surrounded with the under-fill resin.

(Fourth Embodiment)

Figure 5A:
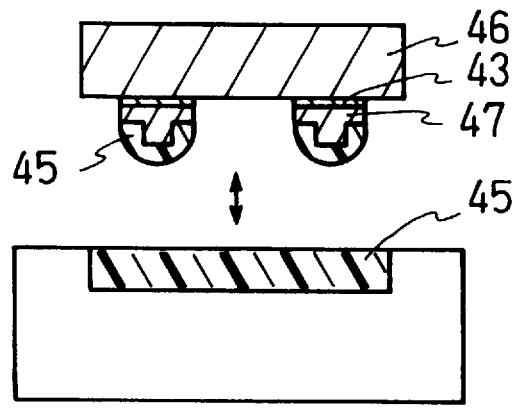
Figure 5B:
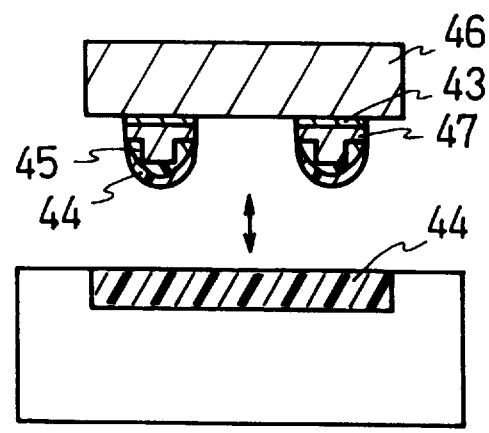
Figure 5C:
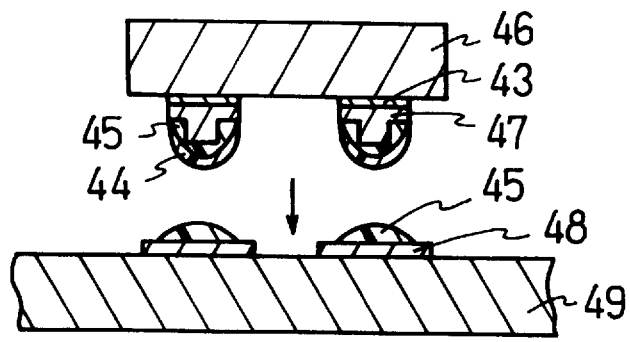
Figure 6:
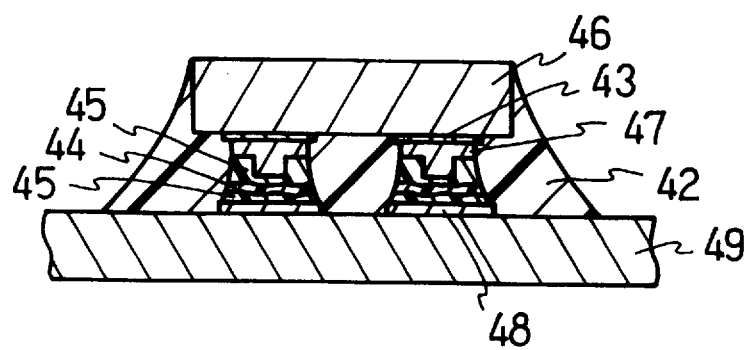
FIG. 6 is a cross-sectional view of the semiconductor unit of the fourth embodiment of the invention.
Figure 7A:
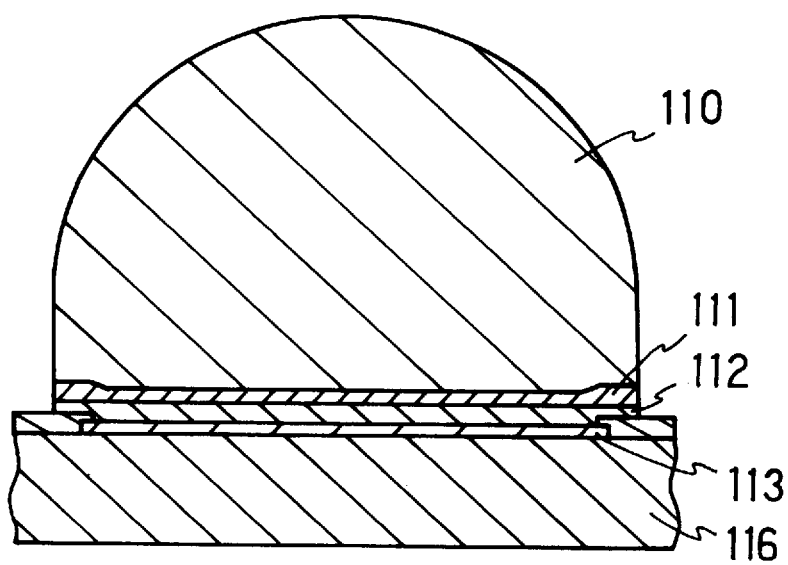
FIG. 7 (*a*) is a cross-sectional view of a solder bump in a conventional semiconductor device.
Figure 7B:
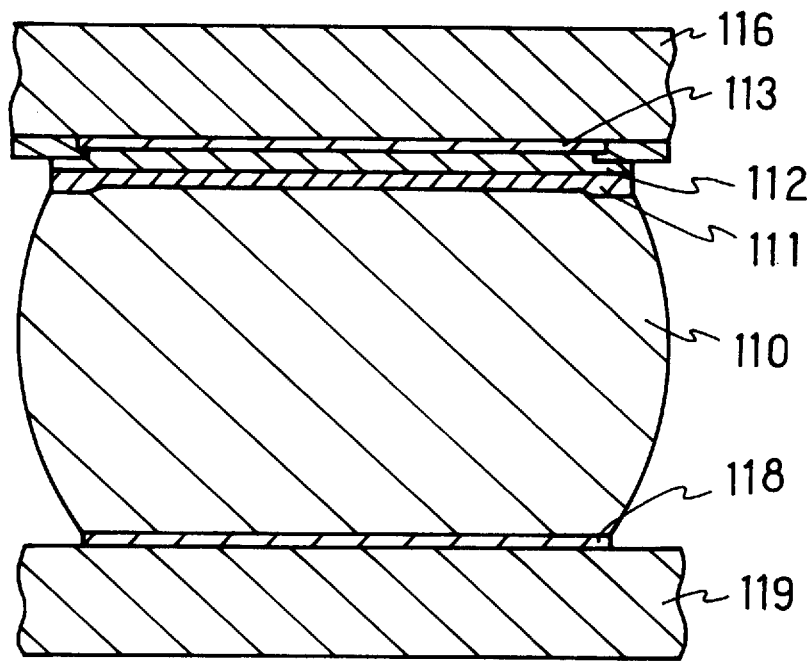
Figure 8:
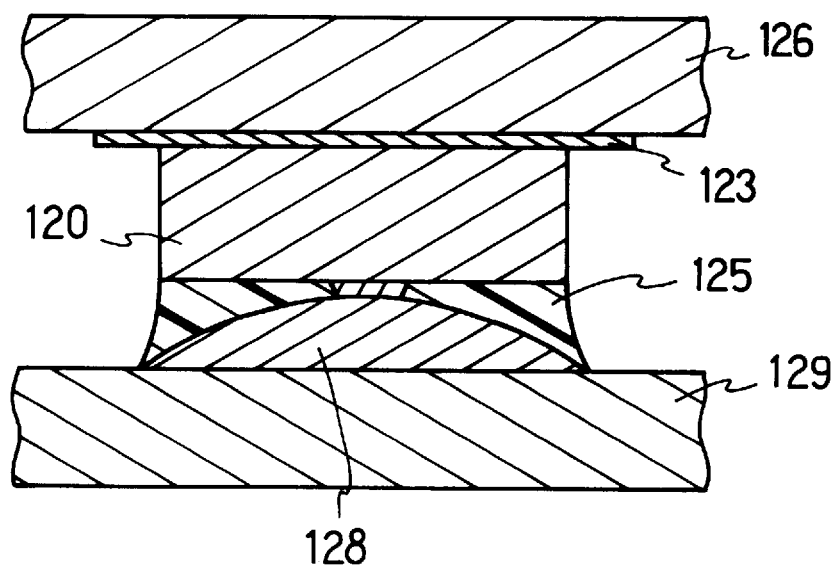
FIG. 8 is a cross-sectional view of a conventional semiconductor unit using a conductive adhesive.

FIGS. 5 (a),(b) and (c) are cross-sectional views showing the manufacturing method for a semiconductor unit of the fourth embodiment of the invention. FIG. 6 is a cross-sectional view of the semiconductor unit of the fourth embodiment.

As shown in these figures, two-step protruding electrodes (bumps) 47 made of Au are formed on electrode pads 43 of a semiconductor device (IC chip) 46. On the other hand, input-output electrodes 48 are formed on a circuit board 49. On the mounting sections of input-output terminal electrodes 48, a second conductive adhesive 45 made of conductive fillers containing simple substance atoms such as a Ag filler is coated beforehand. The coating of second conductive adhesive 45 on the input-output terminal electrodes is carried out, for example, by the steps of transferring the adhesive onto another face down semiconductive device, setting the device in contact with the mounting sections of input-output terminal electrodes 48 of circuit board 49 and then lifting the device.

First of all, as shown in FIG. 5 (a), protruding electrodes (bumps) 47 of face down semiconductor device (IC chip) 46 are provided with a second conductive adhesive 45 made of conductive fillers containing simple substance atoms—for example, Ag conductive filler. Then, as shown in FIG. 5 (b), protruding electrodes (bumps) 47, which have been provided with second conductive adhesive 45, are provided with a first conductive adhesive 44 made of a conductive filler containing at least two kinds of atoms, such as an AgPd conductive filler. As a result, protruding electrodes (bumps) 47 are formed with a bonding layer made of first and second conductive adhesives 44 and 45. Then, as shown in FIG. 5 (c) and FIG. 6, first conductive adhesive 44 on protruding electrodes (bumps) 47 is set in contact with second conductive adhesive 45 on input-output terminal electrodes 48 of the circuit board 49, and semiconductor device (IC chip) 46 is mounted face down on circuit board 49. Finally, as shown in FIG. 6, the gaps between semiconductor device (IC chip) 46 and circuit board 49 and the sides of semiconductor device (IC chip) 46 are underfilled with a underfill resin 42 made of an inorganic rigid filler and organic resin. As a result, a semiconductor unit is provided.

In the semiconductor unit of this embodiment, protruding electrodes (bumps) 47 of semiconductor device (IC chip) 46 and input-output terminal electrodes 48 of circuit board 49 are electrically connected through the bonding layer as described above. Thus, contact resistance decreases at the boundary between second conductive adhesive 45 and protruding electrodes (bumps) 47 and the boundary between second conductive adhesive 45 and circuit board 49, so that the reliability of boundary connection and bonding improves.

Although two-step protruding electrodes (bumps) 47 are used in this embodiment, the shape of the protruding electrodes is not limited to this. However, if the protruding electrodes (bumps) have the two-step shape, no excess amount of conductive adhesive is fixed to the edges of the protruding electrodes (bumps) and the adhesive is coated on the protruding electrodes (bumps) in a preferable amount.

The material of protruding electrodes (bumps) 47 is not limited to Au. The material may be Cu, Al, solder or alloys of Cu, Al and solder.

In this embodiment, the gaps between semiconductor device (IC chip) 46 and circuit board 49 and the sides of semiconductor device (IC chip) 46 are underfilled with under-fill resin 42. However, the underfilling is not limited to this as long as at least the bonding layer (made of first and second conductive adhesive 44 and 45) is surrounded with the under-fill resin.

This invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

What is claimed is:

1. A semiconductor unit comprising a semiconductor device, which comprises protruding electrodes, mounted onto terminal electrodes of a circuit board; wherein said protruding electrodes of said semiconductor device are electrically connected to said terminal electrodes of said circuit board through a bonding layer comprising at least two different kinds of conductive adhesive.

2. The semiconductor unit according to claim 1, said semiconductor unit being underfilled with under-fill resin so as to surround at least the bonding layer; said under-fill resin comprising an inorganic rigid filler and organic resin.

3. The semiconductor unit according to claim 2, wherein the under-fill resin has a pH equal to or less than eight.

4. The semiconductor unit according to claim 1, wherein the protruding electrodes comprise at least one material selected from the group consisting of Au, Cu, Al and solder.

5. The semiconductor unit according to claim 1, wherein the bonding layer comprises a first conductive adhesive and a second conductive adhesive; said first conductive adhesive comprising conductive fillers that comprises at least two kinds of atoms; said second conductive adhesive comprising conductive fillers that comprise one kind of atoms; and wherein at least one section of said second conductive adhesive is in contact with the terminal electrodes of the circuit board.

\* \* \* \* \*